United States Patent
Edahiro et al.

(10) Patent No.: US 8,917,548 B2
(45) Date of Patent: Dec. 23, 2014

(54) NON-VOLATILE SEMICONDUCTOR MEMORY DEVICE

(75) Inventors: Toshiaki Edahiro, Yokohama (JP); Masahiro Noguchi, Tokyo (JP); Koki Ueno, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 224 days.

(21) Appl. No.: 13/537,317

(22) Filed: Jun. 29, 2012

(65) Prior Publication Data

US 2013/0003454 A1    Jan. 3, 2013

(30) Foreign Application Priority Data

Jun. 29, 2011    (JP) ................................ P2011-143781

(51) Int. Cl.
| | | |
|---|---|---|
| G11C 11/34 | (2006.01) | |
| G11C 16/26 | (2006.01) | |
| G11C 11/56 | (2006.01) | |
| G11C 16/04 | (2006.01) | |

(52) U.S. Cl.
CPC ............ *G11C 16/26* (2013.01); *G11C 11/5642* (2013.01); *G11C 16/0483* (2013.01)
USPC ............. 365/185.02; 365/185.03; 365/185.18

(58) Field of Classification Search
CPC ................... G11C 16/0483; G11C 2211/5621; G11C 16/3418; G11C 2211/5642; G11C 7/1051; G11C 7/1006; G11C 16/3427; G11C 7/106; G11C 16/28; G11C 2211/5634; G11C 2211/5648; G11C 7/1048; G11C 29/50
USPC ............. 365/185.02, 185.03, 185.19, 189.05, 365/185.18
See application file for complete search history.

(56) References Cited

U.S. PATENT DOCUMENTS

| | | | |
|---|---|---|---|
| 7,881,120 B2 | 2/2011 | Yoshihara et al. | |
| 7,916,547 B2 | 3/2011 | Hosono | |
| 7,916,933 B2 | 3/2011 | Schwartz et al. | |
| 2008/0158973 A1* | 7/2008 | Mui et al. ................. | 365/185.18 |
| 2008/0239805 A1* | 10/2008 | Shiga et al. .............. | 365/185.03 |
| 2009/0323432 A1 | 12/2009 | Futatsuyama et al. | |
| 2011/0157993 A1* | 6/2011 | Kim ......................... | 365/185.18 |
| 2011/0305089 A1 | 12/2011 | Abe et al. | |

FOREIGN PATENT DOCUMENTS

| | | | |
|---|---|---|---|
| JP | 45-10060 | 4/1970 | |
| JP | 46-35068 | 10/1971 | |
| JP | 2006-172523 | 6/2006 | |
| JP | 2010-9733 | 1/2010 | |
| JP | 2011-258289 | 12/2011 | |
| KR | 102009135628 | * 12/2009 | ............... 365/185.18 |

* cited by examiner

*Primary Examiner* — Richard Elms
*Assistant Examiner* — Ajay Ojha
(74) *Attorney, Agent, or Firm* — Oblon, Spivak, McClelland, Maier & Neustadt, L.L.P.

(57) ABSTRACT

A non-volatile semiconductor memory device according to embodiments has a memory cell array and a reading circuit, and, in a reading sequence, the reading circuit executes a prereading operation of supplying a first reading voltage to an adjacent word line and supplying a first reading pass voltage to a selected word line, and after executing the prereading operation, executes a main reading operation of supplying a fixed second reading voltage to the selected word line and supplying a fixed second reading pass voltage to the adjacent word line while sensing a plurality of electrical physical amounts of a target memory cell with different reading conditions.

20 Claims, 9 Drawing Sheets

NON-VOLATILE SEMICONDUCTOR MEMORY DEVICE

CROSS-REFERENCE TO RELATED APPLICATIONS

This application is based upon and claims the benefit of priority from the prior Japanese Patent Application No. 2011-143781, filed on Jun. 29, 2011, the entire contents of which are incorporated herein by reference.

FIELD

Embodiments relate to a non-volatile semiconductor memory device.

BACKGROUND

NAND flash memories are known as non-volatile semiconductor memory devices which can be electrically rewritten and enable higher integration.

A memory cell of a NAND flash memory has a charge storage layer (floating gate) formed on a semiconductor substrate through a tunnel insulating film and a control gate which is laminated thereon through an inter-gate insulating film, and enables non-volatile storage of data in a charge storage state of the floating gate. For example, the memory cell stores binary data assuming that a threshold voltage is high when electrons are injected to the floating gate is data "0" and a threshold voltage is low when electrons in the floating gate are ejected is data "1". The memory cell also enables multi-value storage such as quadrature storage or octal storage by further segmentalizing a threshold voltage distribution to be written.

However, there is a problem that, accompanying further miniaturization of memory cell arrays in recent years, an influence of an inter-cell interference between adjacent memories is increasing and thresholds of the adjacent memory cells also fluctuate when data is written in a selected memory cell. The same applies to charge trap non-volatile memories in which charge storage layers are formed with insulating films such as MONOS films.

DETAILED DESCRIPTION

The non-volatile semiconductor memory device according to an embodiment has: a memory cell array which has a plurality of bit lines, a plurality of word lines and source lines crossing the bit lines, and a plurality of memory cells which have control gates connected to the word lines and which are connected in series, and which has a plurality of NAND strings with both ends connected to the bit lines and the source lines, respectively; and a reading circuit which executes a reading sequence of reading data from a target memory cell of the plurality of memory cells which is a reading target. When the word line connected to the target memory cell is a selected word line and a word line adjacent to the selected word line is an adjacent word line among the word lines, in the reading sequence, the reading circuit executes a prereading operation of supplying a first reading voltage to the adjacent word line and supplying a first reading pass voltage for conducting the memory cells, to the selected word line, and after executing the prereading operation, executes a main reading operation of supplying a fixed second reading voltage to the selected word line and supplying a fixed second reading pass voltage for conducting the memory cells, to the adjacent word line while sensing a plurality of electrical physical amounts of the target memory cell which appear in the bit lines.

Hereinafter, a non-volatile semiconductor memory device according to embodiments will be described with reference to drawings.

First Embodiment

First, a configuration of a NAND flash memory (non-volatile semiconductor memory device) according to a first embodiment will be described.

Figure 1:
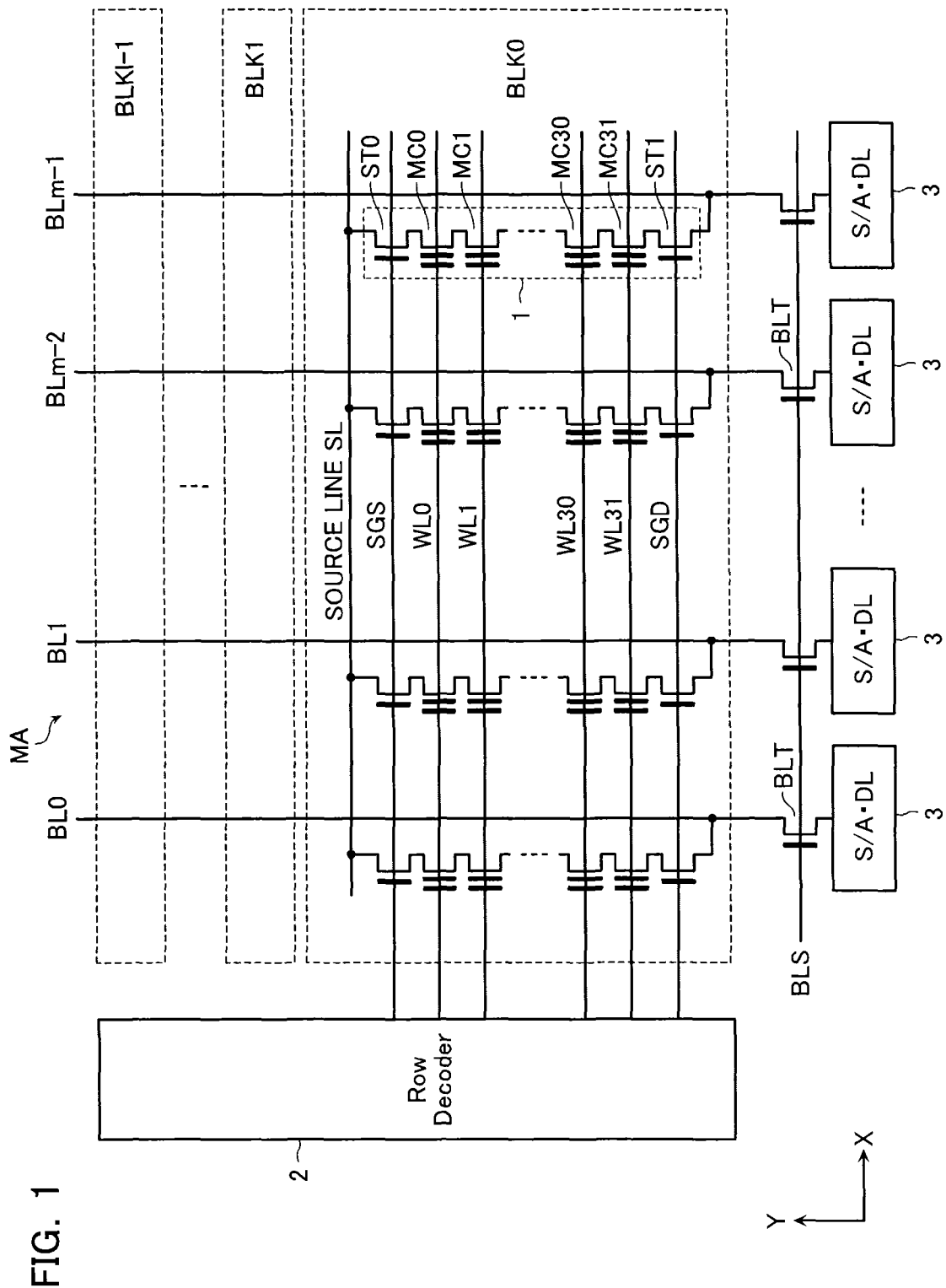
FIG. 1 is an arrangement diagram of a memory cell array and reading circuits of a non-volatile semiconductor memory device according to a first embodiment.

FIG. 1 is a view illustrating a memory cell array and reading circuits of the NAND flash memory according to the present embodiment. A NAND string 1 of the NAND flash memory has a source side selected gate transistor ST0, a drain side selected gate transistor ST1 and a plurality of memory cells MC0 to MC31 connected in series between the selected gate transistors ST0 and ST1. In the NAND string 1, a plurality of adjacent memory cells MC share source/drain regions.

The memory cell MC has an N-type source/drain region in a P-type well formed in a silicon substrate, and adopts a laminated gate structure having a control gate and a floating gate which is a charge storage layer. In the NAND flash memory, the amount of electron held in this floating gate is changed by a writing operation or an erasing operation. By this means, a threshold voltage of the memory cell MC is changed to store one bit or multibit data in one memory cell MC.

Control gates of a plurality of memory cells MC aligned in an X direction in FIG. 1 are commonly connected by word lines WL0 to WL 31. Further, gates of a plurality of source side selected gate transistors ST0 are commonly connected by a source side selected gate line SGS. Furthermore, gate electrodes of a plurality of drain side selected gate transistors ST1 are commonly connected by a drain side selected gate line SGD. In the NAND flash memory, a plurality of assemblies of NAND strings 1 sharing word lines WL form a block BLK. A memory cell array MA is formed with a plurality of (for example, I) block BLK0, BLK1, . . . and BLKI−1.

The drain side selected gate transistor ST1 is connected to a bit line BL. Further, the source side selected gate transistor ST0 is connected to a source line SL. At one end of the bit line BL, a sense amplifier/data latch 3 is arranged which has a sense amplifier S/A and a data latch DL which perform an operation of reading data of a memory cell MC. Further, at one end of the word lines WL, a row decoder 2 is arranged which selects and drives the word lines WL and selected gate lines SGS and SGD.

These row decoder 2 and sense amplifier/data latches 3 form a part of a reading circuit.

Meanwhile, m bit lines BL are arranged in one block BLK. The bit line BL and the sense amplifier/data latch 3 are connected through a bit line selected transistor BLT. The bit line selected transistor BLT is controlled by a bit line selecting line BLS to turn on and off When the bit line selected transistor BLT is conducted by the bit line selecting line BLS, bit lines BL0 to BL m−1 are selected and driven by the sense amplifier/data latches 3.

Figure 2:
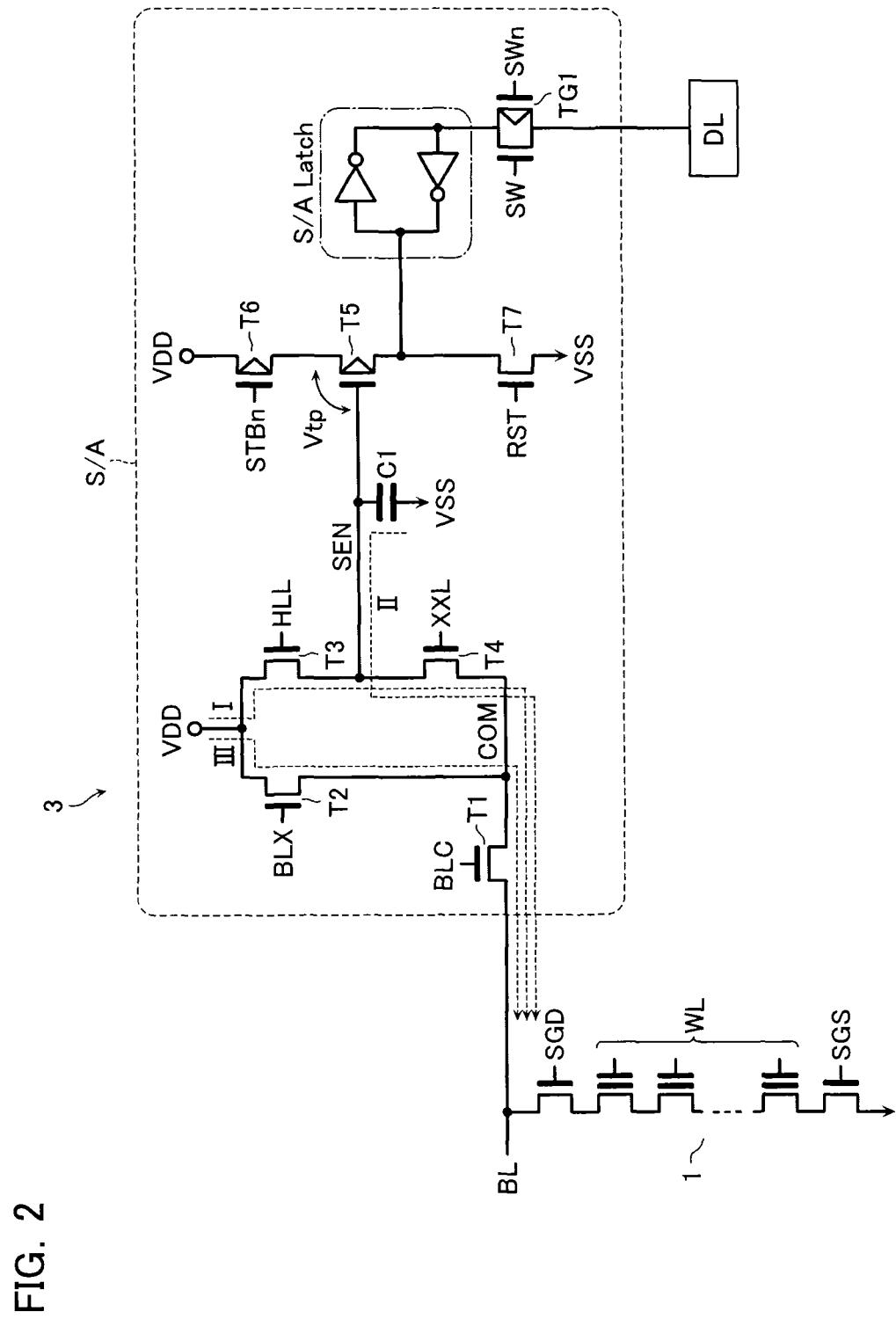
FIG. 2 is a view illustrating apart of a configuration of the reading circuit of the non-volatile semiconductor memory device according to the first embodiment.

FIG. 2 is a view illustrating a circuit configuration of the sense amplifier/data latch 3 which is part of the reading circuit.

The sense amplifier/data latch 3 includes the sense amplifier S/A connected to the bit line BL, and a data latch DL which holds a sensing result of this sense amplifier S/A.

The sense amplifier S/A has: a clamping NMOS transistor T1 which is connected between a node COM and the bit line BL, and which receives a supply of a control voltage BLC at a gate; a current continuously-supplying NMOS transistor T2 which is connected between a power terminal VDD and the node COM, and which receives a supply of a control voltage BLX at a gate; a precharging NMOS transistor T3 which is connected between the power terminal VDD and a sensing node SEN, and which receives a supply of a control voltage HLL at a gate; a charge transferring NMOS transistor T4 which is connected between the sensing node SEN and the node COM, and which receives a supply of a control voltage XXL at a gate; a capacitor C1 which is connected between the sensing node SEN and a ground terminal VSS; a PMOS transistor T5 which has a gate connected to the sensing node SEN; a PMOS transistor T6 which is connected between a power terminal VDD and a drain of the transistor T5, and which receives a supply of a control voltage STBn at a gate; an NMOS transistor T7 which is connected between a source of the transistor T5 and a ground terminal VSS, and which receives a supply of a control voltage RST at a gate; a sense amplifier latch which includes a latch circuit composed of two inverters, and which has an input connected to a node between the transistor T5 and the transistor T7; and a transfer gate TG1 which is connected between the other input of the sense amplifier latch and the data latch DL, and which is controlled according to signals SW and SWn. This sense amplifier S/A is a sense amplifier of an All Bit Line (ABL) scheme.

Next, an operation of the sense amplifier/data latch 3 will be described. In addition, note that the following numerical values are only examples for ease of understanding.

When a threshold of the NMOS transistor is VthN, a control voltage of the precharging NMOS transistor T3 is set to HLL=VDD+VthN, a control voltage of the current continuously-supplying NMOS transistor T2 is set to BLX=0.7 V+VthN, a control voltage of the charge transferring NMOS transistor T4 is set to XXL=0.9 V+VthN, and a control voltage of the clamping NMOS transistor T1 is BLC=0.5 V+VthN.

By this means, the sensing node SEN is precharged to the power voltage VDD, and the bit line BL is charged up to about 0.5 V at maximum and enters a stationary state.

Although, when the memory cell MC (hereinafter, "target memory cell") which is a data reading target is an off cell, the current does not basically flow in the bit line BL, a level of the bit line BL which is being precharged is charged to 0.5 V at maximum, when the target memory cell MC is an on cell, a cell current (electrical physical amount) flows in the bit line BL, and the level of the bit line BL enters a stationary state in a state where the current flowing in the target memory cell MC and the current supplied from the sense amplifier S/A balance out and becomes an intermediate level between 0.5 V and 0 V.

A current route of the current flowing to the bit line BL in this state is indicated by I in FIG. 2. When the level of the bit line BL reaches the stationary state, the control voltage is set to HLL=0 V and charging of the capacitor C1 connected to the sensing node SEN is stopped.

By this means, a current route of the current flowing to the bit line BL is indicated by II in FIG. 2. According to the relationship of XXL>BLX, a charge is preferentially transferred from the capacitor C1 of the sensing node SEN to the bit line BL. Corresponding to a cell current, the voltage of the sensing node SEN changes. Further, when the level of the sensing node SEN lowers and reaches to 0.7 V, the transistor T4 turns off, and the current is supplied to the bit line BL through the transistor T2 thereafter. A current route of the current flowing to the bit line BL in this case is indicated by III in FIG. 2. By this means, the level of the bit line BL is held.

After a certain period of time elapsed, the level of the sensing node SEN reaches to a level determined according to a cell current, and is discriminated by a discriminating circuit including the transistors T5 to T7 and is held by the sense amplifier latch (S/A Latch). Further, when the result of this sense amplifier latch is valid, a transfer gate TG1 is turned on according to the signals SW and SWn to take in this result into the data latch DL.

Next, a data storage state of the NAND flash memory according to the present embodiment will be described.

Figure 3:
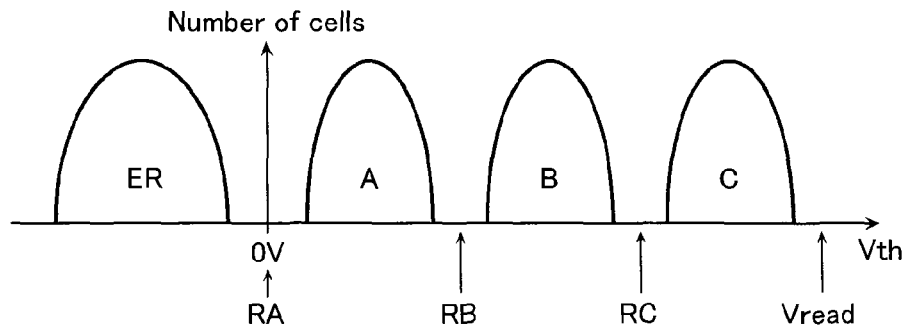
FIG. 3 is a view illustrating a threshold voltage distribution of a memory cell of the non-volatile semiconductor memory device according to the first embodiment.

With the present embodiment, the memory cell MC of the NAND flash memory is assumed to store multi-value data such as quadrature data (two bits/cell). In this case, a threshold voltage distribution matching data is as illustrated in FIG. 3. In the memory cell MC, four types of threshold voltage distributions are set in order from lower voltage levels of an ER level, an A level, a B level and a C level. Further, four types of data "11", "01", "00" and "10" are assigned to these threshold voltage distributions. Meanwhile, data is represented by upper page data and lower page data. In addition, the ER level refers to a negative threshold voltage distribution obtained by an erase operation.

With the reading operation of the NAND flash memory, a read pass voltage Vread for conducting non-target memory cells MC irrespectively of data is supplied to non-selected word lines WL in the memory cell array MA.

Further, upon an operation of reading quadrature value, the voltage applied to the selected word line WL is set to a reading voltage RA, RB or RC which is a voltage between the threshold voltage distributions according to the four types of threshold voltage distributions of the target memory cell MC. The reading voltage RA is the lowest voltage, and the voltage increases in order from RB and RC. Upon the operation of reading quadrature data, data is read by detecting at which one of the reading voltages RA, RB and RC the current flows in the NAND string 1.

Next, an inter-cell interference effect in the NAND flash memory according to the present embodiment will be described.

Figure 4:
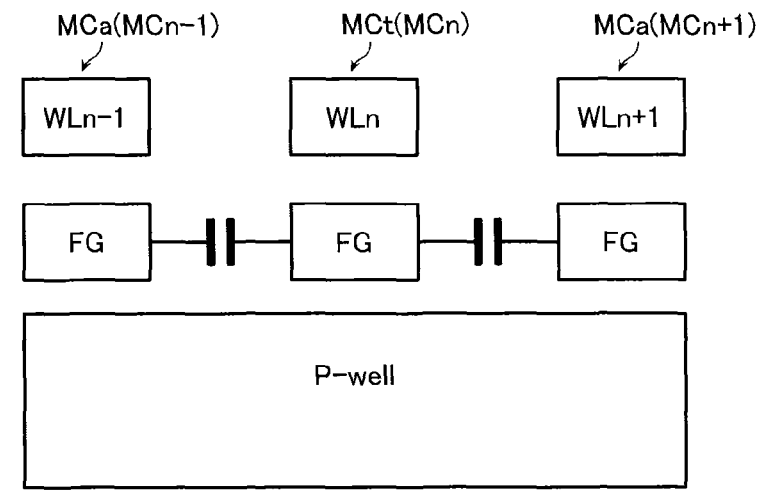
FIG. 4 is a view illustrating a coupling capacitance between floating gates of adjacent memory cells of the non-volatile semiconductor memory device according to the first embodiment in a bit line direction.
Figure 5:
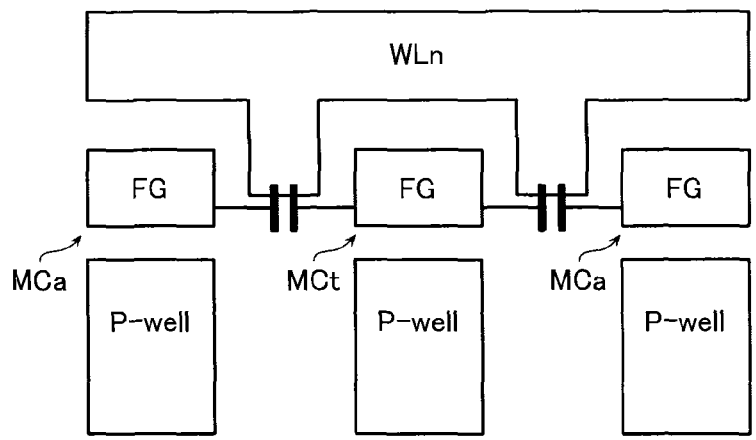
FIG. 5 is a view illustrating a coupling capacitance between floating gates of adjacent memory cells of the non-volatile semiconductor memory device according to the first embodiment in a word line direction.

FIG. 4 is a view illustrating a state of capacitance coupling between floating gates of memory cells adjacent in a bit line direction, and FIG. 5 is a view illustrating a state of capacitance coupling between floating gates of memory cells adjacent in a word line direction. Hereinafter, a case will be described as an example where a writing operation is executed for a target memory cell MCt and a writing operation is then executed for an adjacent memory cell MCa.

In this case, when the writing operation is executed for the adjacent memory cell MCa, a threshold voltage of the adjacent memory cell MCa rises, and a potential of the floating gate FG of the adjacent memory cell MCa decreases. As a result, a threshold voltage Vth of the target memory cell MCt transitions to a high voltage side. This is the inter-cell interference effect.

The inter-cell interference effect received from a memory cell adjacent in the bit line direction is also referred to simply as an "inter-cell interference effect in the bit line direction". Similarly, as illustrated in FIG. 5, the inter-cell interference effect received from a memory cell adjacent in the word line direction is also referred to simply as an "inter-cell interference effect in the word line direction".

Figure 6:
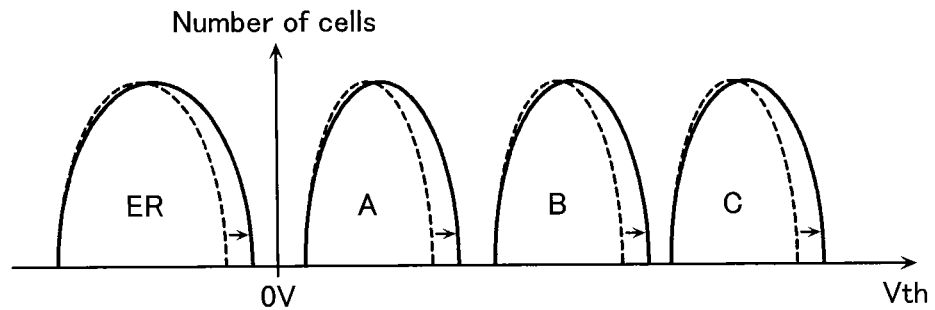
FIG. 6 is a view illustrating fluctuation of a threshold voltage distribution of the memory cell resulting from an inter-cell interference effect in the non-volatile semiconductor memory device according to the first embodiment.

The amount of fluctuation of the threshold voltage Vth resulting from this inter-cell interference effect is determined based on, for example, a data pattern of the memory cells MC arranged around the target memory cell MCt, the amount of fluctuation of the threshold voltage Vth of the adjacent memory cell MCa, and a coupling ratio between the target memory cell MCt and the adjacent memory cells MCa. Hence, threshold voltage distributions of the memory cell MC before the inter-cell interference effect indicated by dotted lines in FIG. 6 is widen as indicated by solid lines in FIG. 6. As a result, margins between the threshold voltage distributions decreases, thereby leading to a decrease in reliability of data.

Next, the amount of fluctuation of a threshold voltage of a target memory cell resulting from a writing operation for a memory cell adjacent in the word line direction will be described in more detail.

Figure 7:
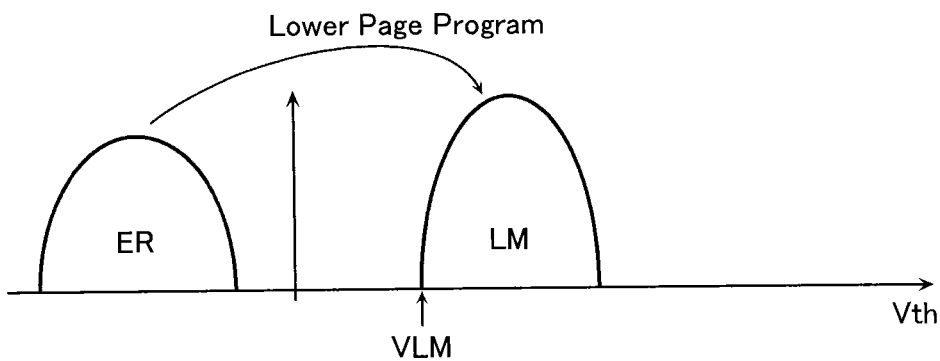
FIG. 7 is a view illustrating fluctuation of a threshold voltage distribution of the memory cell according to a lower page program in the non-volatile semiconductor memory device according to the first embodiment.
Figure 8:
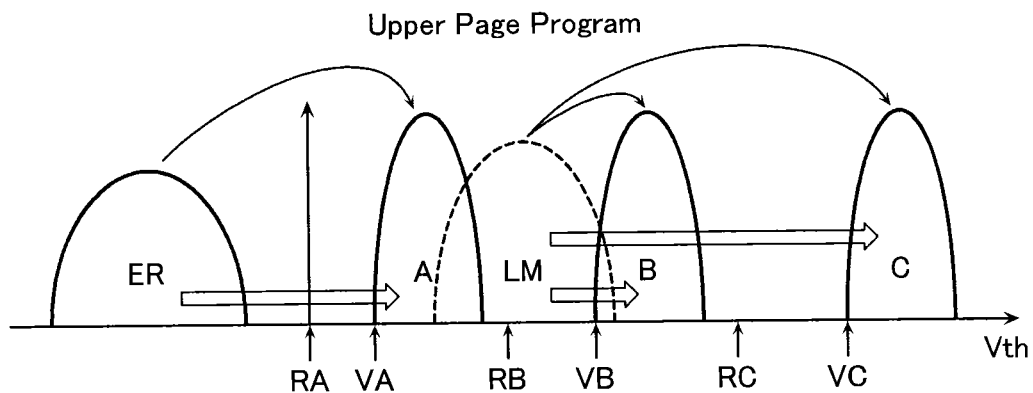
FIG. 8 is a view illustrating fluctuation of a threshold voltage distribution of the memory cell according to an upper page program in the non-volatile semiconductor memory device according to the first embodiment.

FIGS. 7 and 8 are views illustrating examples of a writing sequence of the NAND flash memory. These are examples where quadrature data is written in one memory cell. The writing sequence of quadrature data is realized by two stages of the writing operation including a lower page program of transitioning the threshold voltage Vth based on lower page data and an upper page program of transitioning the threshold voltage Vth based on upper page data.

First, all memory cells MC in a selected block BLK are erased. By this means, the threshold voltages Vth of all memory cells MC in the selected block BLK are set to the ER level which is a negative voltage.

Then, the lower page program is executed. As illustrated in FIG. 7, the lower page program is directed to increasing the threshold voltages Vth of part of the memory cells MC having the threshold voltages at the ER level to a LM level between the A level and the B level. A memory cell MC which is a target of the lower page program is a memory cell MC having lower page data of "0".

Finally, the upper page program is executed. As illustrated in FIG. 8, the upper page program is directed to increase the threshold voltage Vth of the memory cell MC in which "01" needs to be programmed, from the ER level to the A level. Further, the threshold voltage Vth of the memory cells MC in which "00" and "10" need to be programmed is increased from the LM level to the B level and the C level, respectively.

Thus, a series of the writing sequence is completed.

Meanwhile, the writing sequence is executed in order from the memory cell MC the closest to the source side selected gate line SGS. More specifically, when a predetermined memory cell MCn is a target memory cell, an erasing operation for all memory cells, ..., the lower page program for the target memory cell MCn, the lower page program for the adjacent memory cell MCn+1, ..., the upper page program for the target memory cell MCn, the upper page program for the adjacent memory cell MCn+1 and ... are executed in order.

Further, the inter-cell interference effect resulting from the lower page program is canceled by the upper page program executed thereafter, and therefore the amount of fluctuation of the threshold voltage Vth of the target memory cell MCn is mainly caused by the inter-cell interference effect resulting from the upper page program for the adjacent memory cell MCn+1 on the drain side selected gate line SGD side.

Furthermore, the influence on the threshold voltage Vth of the target memory cell MCn is greater when the threshold voltage Vth of the adjacent memory cell MCn+1 is increased from the ER level to the A level or from the LM level to the C level than when the threshold voltage Vth is increased from the LM level to the B level, since the amount of fluctuations are greater as indicated outlined arrows in FIG. 8.

To summarize the above, the amount of fluctuation of a threshold voltage of the target memory cell MCn changes depending on the following situations of the adjacent memory cell MCn+1.

<Situation 11> The threshold voltage Vth of the adjacent memory cell MCn+1 is at the ER level or the B level.

<Situation 12> The threshold voltage Vth of the adjacent memory cell MCn+1 is at the A level or the C level.

Consequently, by executing a reading operation for the target memory cell MCn depending on a condition according to these situations, it is possible to adequately correct the threshold voltage Vth of the target memory cell MCn.

Although the reading sequence according to the present embodiment of correcting a threshold voltage of a target memory cell will be described next, a reading sequence according to a comparative example will be described beforehand.

Figure 18:
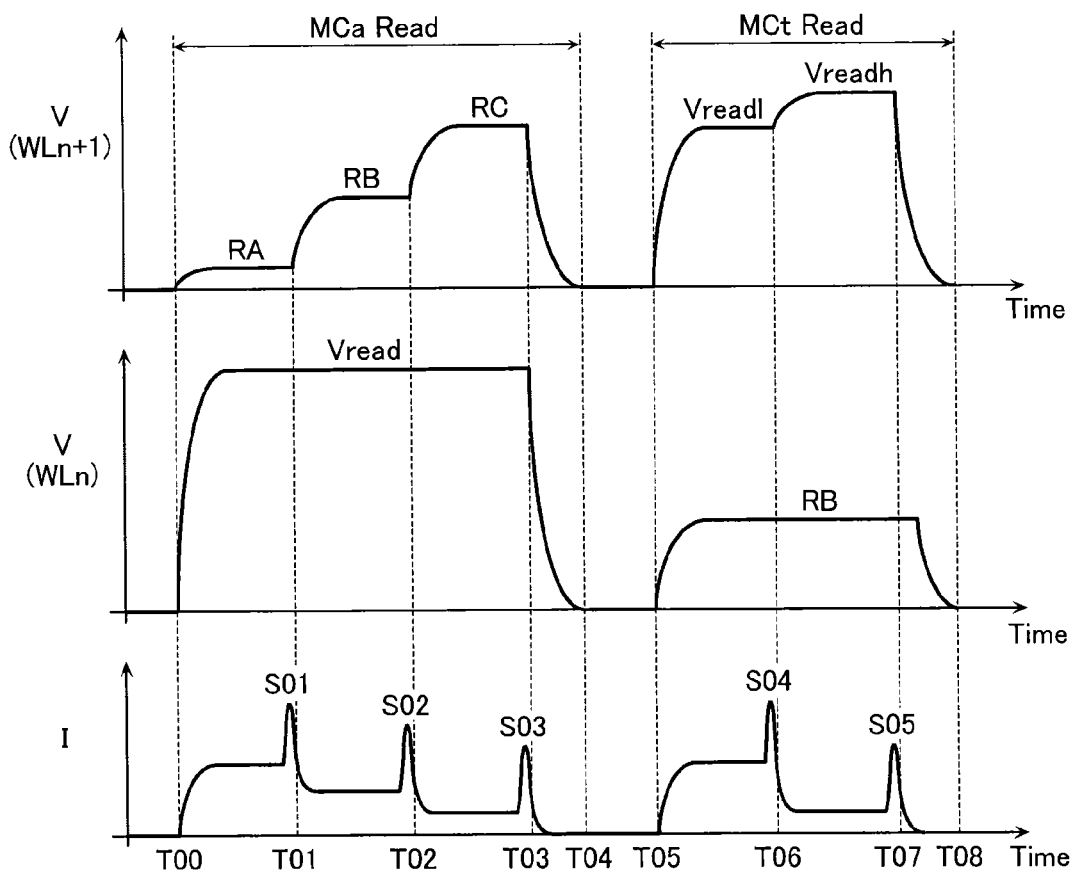
FIG. 18 is an operation waveform diagram upon a reading sequence in a non-volatile semiconductor memory device according to a comparative example with respect to the first embodiment.

FIG. 18 is an operation waveform diagram of word lines WLn+1 and WLn, and the bit line BL upon the reading sequence according to the comparative example. The word line WLn+1 is adjacent to the drain side selected gate line SGD side of the word line WLn connected to the target memory cell MCn. Hereinafter, a word line adjacent to a selected word line is also referred to as an "adjacent word line". Further, the adjacent memory cell MCa illustrated in FIG. 18 is a memory cell MCn+1 connected to the adjacent word line WLn+1, and the target memory cell MCt is the memory cell MCn connected to the selected word line WLn.

First, in a period between T00 and T04, a reading operation is executed for determining at which one of the ER level, the A level, the B level and the C level the threshold voltage the adjacent memory cell MCa is. Hereinafter, the reading operation for the adjacent memory cell MCa is also referred to as a "prereading operation".

In a period between T00 and T01, whether or not a threshold voltage of the adjacent memory cell MCa is at the A level or more is confirmed. Meanwhile, the reading voltage RA is supplied to the adjacent word line WLn+1, and the reading pass voltage Vread is supplied to the selected word line WLn.

In a period between T01 and T02, whether or not a threshold voltage of the adjacent memory cell MCa is at the B level or more is confirmed. Meanwhile, the reading voltage RB is supplied to the adjacent word line WLn+1, and the reading pass voltage Vread is continuously supplied to the selected word line WLn.

In a period between T02 and T03, whether or not a threshold voltage of the adjacent memory cell MCa is at the C level or more is confirmed. Meanwhile, a reading voltage RC is supplied to the adjacent word line WLn+1, and the reading pass voltage Vread is continuously supplied to the selected word line WLn.

In addition, with the prereading operation according to the comparative example, once in each period between T00 and T01 between T01 and T02 and between T02 and T03, the sense amplifier S/A executes sensing operations S01 to S03, and therefore a peak Icc current appears to the sensing operation.

Subsequently, in a period between T05 and T08, the reading operation is executed for the threshold voltage of the target memory cell MCt. Hereinafter, the reading operation for the target memory cell MCt is also referred to as the "main reading operation".

The period between T05 and T06 is a sensing period of the threshold voltage of the target memory cell MCt when <situation 11> takes place as a result of the prereading operation. Meanwhile, the reading pass voltage Vread (hereinafter, a "low reading pass voltage") equal to or more than an upper limit of the threshold voltage distribution of the C level is supplied to the adjacent word line WLn+1. Further, the reading voltage RB is supplied to the selected word line WLn to decide lower page data of the target memory cell MCt.

A period between T06 and T07 is a corresponding sensing period of the threshold of the target memory cell MCt when <situation 21> takes place as a result of the prereading operation. Meanwhile, a reading pass voltage Vreadh (hereinafter referred to as a "high reading pass voltage") higher than a low reading pass voltage Vread is supplied to the adjacent word line WLn+1, and the reading voltage RB is continuously supplied to the selected word line WLn.

Then, once in each period between T05 and T06 and between T06 and T07, the sense amplifier S/A executes sensing operations S04 and S05. Further, incase of <situation 11>, data of the target memory cell MCt is determined based on a result of the sensing operation S04, and, in case of <situation 12>, data of the target memory cell MCt is determined based on a result of the sensing operation S05.

Thus, in case of <situation 12>, that is, when an inter-cell interference effect from the adjacent memory cell in the adjacent word lines WL is significant, by supplying a higher reading pass voltage Vreadh to the adjacent word line WLn+1, it is possible to substantially decrease the threshold voltage of the target memory cell MCt by capacitance coupling between the target memory cell MCt (MCn) and the adjacent memory cell MCa (MCn+1). As a result, it is possible to substantially narrow each threshold voltage distribution widened by the inter-cell interference effect from the adjacent memory cell in the adjacent word line, consequently, improve reliability of data.

In addition, with the main reading operation according to the comparative example, once in each period between T05 and T06 and between T06 and T07, the sense amplifier S/A executes the sensing operation, and then an Icc peak current appears due to resulting the sensing operation. Further, in each period between T05 and T06 and between T06 and T07, a different voltage is supplied to each adjacent word line WL and, further, the reading voltage is not supplied to the bit line BL connected the sense amplifier S/A which senses "1", and therefore an Icc current value in a stable period of the bit line BL is also different in each period.

Figure 9:
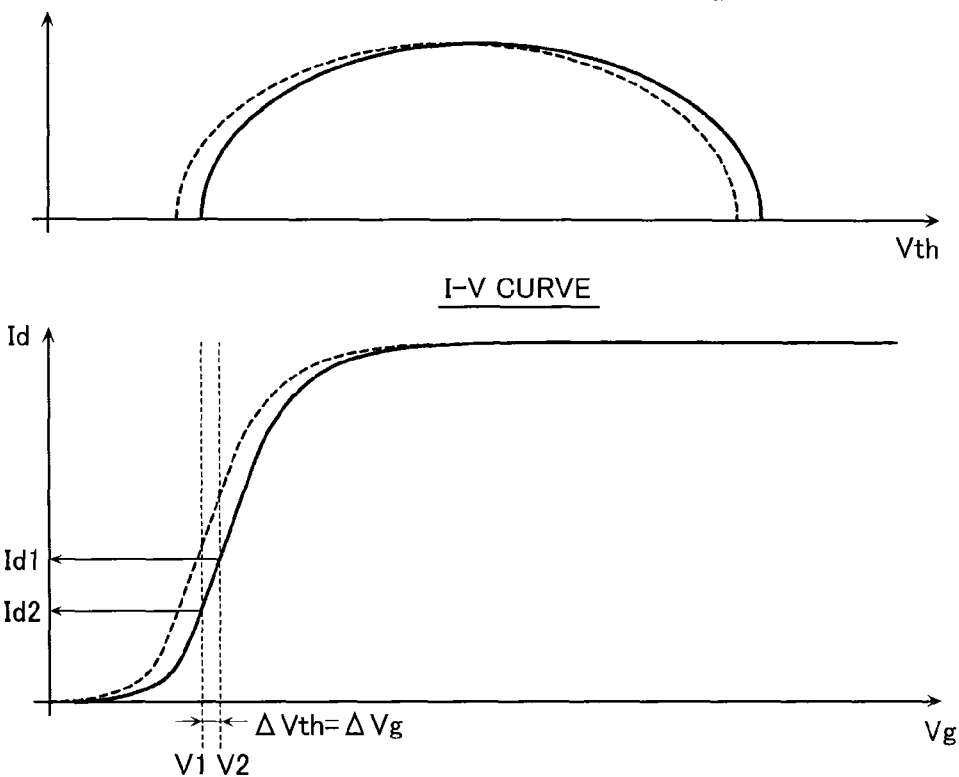
FIG. 9 is a view illustrating the threshold voltage distribution of the memory cell of the non-volatile semiconductor memory device according to the first embodiment, and characteristics of a gate voltage and a cell current.

FIG. 9 is a view illustrating a threshold voltage distribution of a memory cell, and an I-V curve indicating a relationship between a gate voltage Vg of the memory cell and a cell current Id (electrical physical amount). A dotted line in FIG. 9 indicates a state where there is no inter-cell interference effect, and a solid line in FIG. 9 indicates a state where there is an inter-cell interference effect. As illustrated in FIG. 9, when there is an inter-cell interference effect, a threshold voltage distribution of a memory cell rises.

In this case, when the sense amplifier S/A senses a cell current Id1 and when there is no inter-cell interference effect, the gate voltage Vg of the memory cell MC only needs to be set to a voltage V1. However, when there is an inter-cell interference effect, the threshold voltage distribution rises as indicated by the solid line in FIG. 9, and therefore it is necessary to apply a voltage V2 which is ΔVg higher than the voltage V1 as the gate voltage. In this regard, in case of the main reading operation according to the comparative example, the high reading pass voltage Vreadh has a value which is ΔVg/α (α is a coupling ratio of the adjacent word line WLn+1 and the selected word line WLn) higher than the low reading pass voltage Vreadl. By this means, with the main reading operation according to the comparative example, it is possible to sense the cell current Id1 irrespectively whether or not there is an inter-cell interference effect.

However, with the main reading operation according to this comparative example, it is necessary to change a level of the adjacent word line WLn+1, and therefore awaiting time the adjacent word line WLn+1, the selected word line WLn and the bit line BL to be stable is required. This waiting time causes a problem that a processing time of the reading sequence according to the comparative example becomes long.

Meanwhile, based on an I-V curve illustrated in FIG. 9, when the gate voltage Vg of the memory cell MC is V1, the cell current Id1 flows when there is no inter-cell interference effect, and a cell current Id2 smaller than the cell current Id1 flows when there is an inter-cell interference effect.

Hence, with the present embodiment, data of a target memory cell is determined based on a sensing result of the cell current Id1 when there is no inter-cell interference effect, and data of a target memory cell is determined based on a sensing result of the cell current Id2 when there is an inter-cell interference effect. In this case, the level of the adjacent word line WLn+1 upon the main reading operation can be fixed at the voltage V1, so that, as in the comparative example, it is not necessary to provide a waiting time the adjacent word line WLn+1, the selected word line WLn and the bit line BL to be stable.

Figure 10:
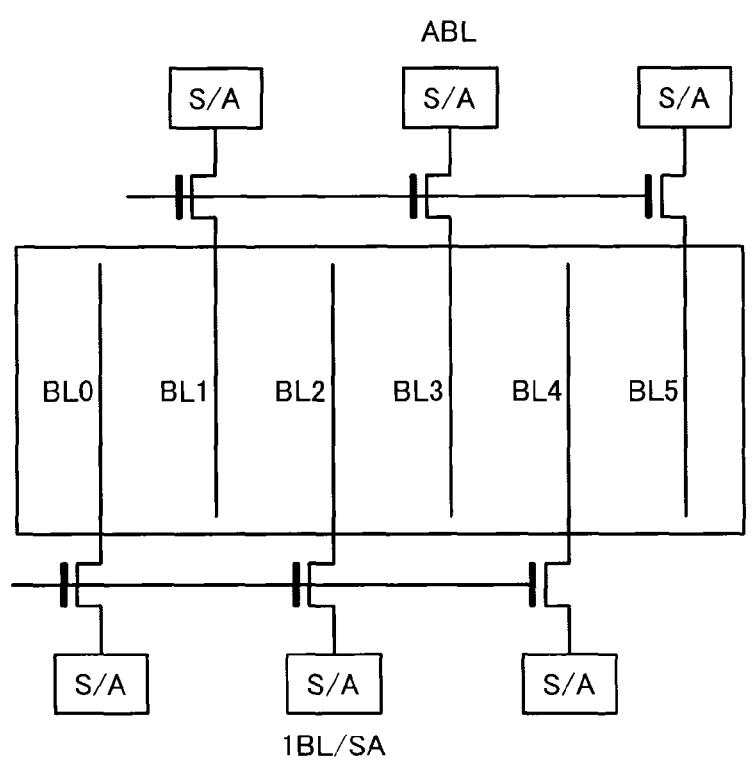
FIG. 10 is a conceptual diagram of a sense amplifier of the non-volatile semiconductor memory device according to the first embodiment.

Next, the reading sequence according to the present embodiment will be described more in details. In addition, as illustrated in FIG. 10, the reading sequence described here assumes a NAND flash memory having the sense amplifier S/A per bit line BL, and the reading operation of the ABL scheme.

As described above, in case of <situation 11>, an inter-cell interference effect which the target memory cell MCt receives from the adjacent memory cell MCa is small, and therefore the threshold voltage distribution of the target memory cell MCt and the I-V curve are as indicated by the dotted line in FIG. 9. By contrast with this, in case of <situation 12>, an inter-cell interference effect received from the adjacent memory cell MCn+1 is large, and therefore the threshold voltage distribution of the target memory cell MC and the I-V curve are as indicated by the solid line in FIG. 9.

Figure 11:
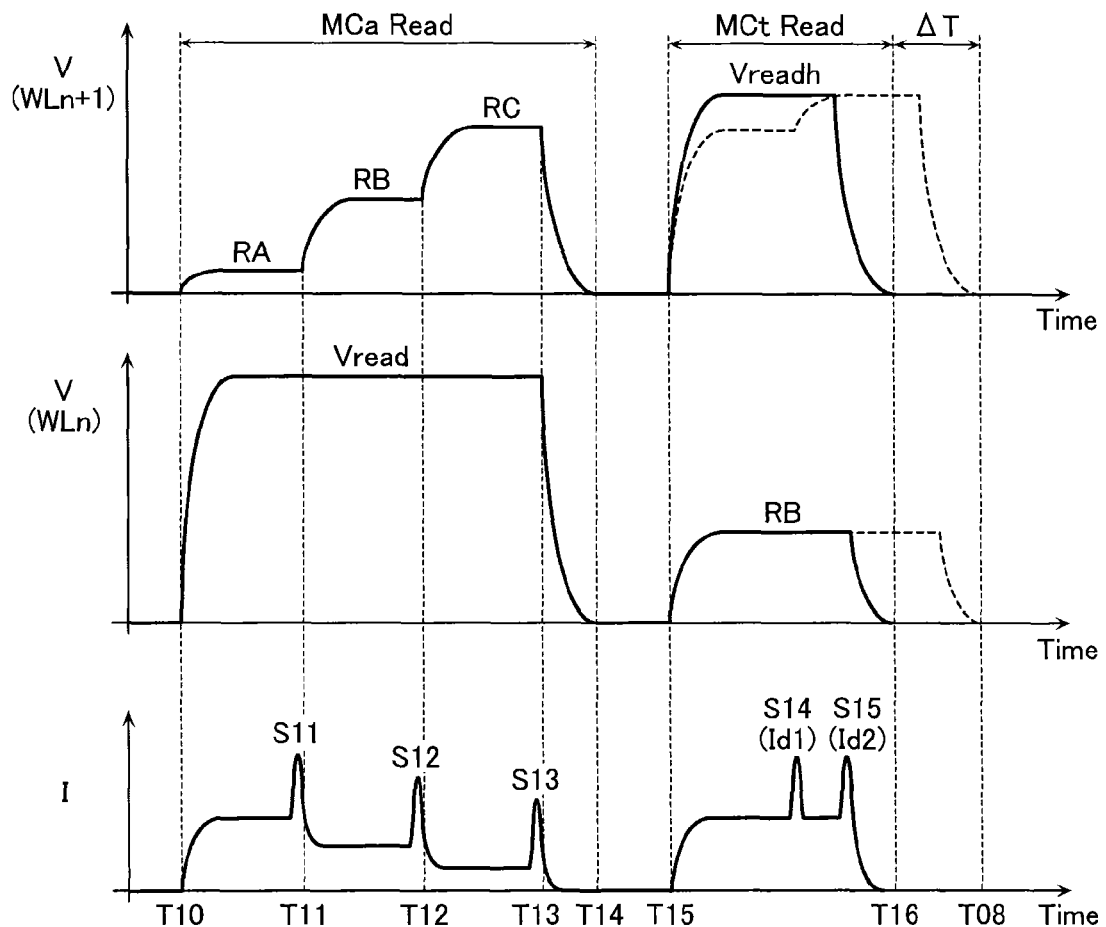
FIG. 11 is an operation waveform diagram upon a reading sequence in the non-volatile semiconductor memory device according to the first embodiment.

FIG. 11 is an operation waveform diagram of the adjacent word lines WLn+1, the selected word line WLn, and the bit line BL upon the reading sequence according to the present embodiment.

First, in a period between T10 and T14, the prereading operation is executed for the adjacent memory cell MCa.

In a period between T10 and T11, whether or not a threshold voltage of the adjacent memory cell MCa is at the A level or more is confirmed. Meanwhile, the reading voltage RA (first reading voltage) is supplied to the adjacent word line WLn+1, and the reading pass voltage Vread (first reading pass voltage) is supplied to the selected word line WLn.

In a period between T11 and T12, whether or not a threshold voltage of the adjacent memory cell MCa is at the B level or more is confirmed. Meanwhile, the reading voltage RB (first reading voltage) is supplied to the adjacent word line WLn+1, and the reading pass voltage Vread is continuously supplied to the selected word line WLn.

In a period between T12 and T13, whether or not a threshold voltage of the adjacent memory cell MCa is at the C level or more is confirmed. Meanwhile, the reading voltage RC (first reading voltage) is supplied to the adjacent word line WLn+1, and the reading pass voltage Vread is continuously supplied to the selected word line WLn.

When the threshold voltage of the adjacent memory cell MCa is at the ER level or the B level as a result of the prereading operation, that is, in case of <situation 11>, "0" is held in the data latch DL. Meanwhile, when the threshold voltage of the adjacent memory cell MCn+1 is at the A level or the C level, that is, in case of <situation 12>, "1" is held in the data latch DL.

Subsequently, in a period between T15 and T16, the main reading operation is executed for the target memory cell MCt.

Meanwhile, for example, the high reading pass voltage Vreadh (second reading pass voltage) is supplied to the adjacent word line WLn+1 as a fixed voltage, and the reading voltage RB (second reading voltage) is supplied to the selected word line WLn, and sensing operations including a sensing operation S14 of the cell current Id1 and a sensing operation S15 of the cell current Id2 are executed two times in total in a level stable period of the word lines WLn+1 and WLn.

In addition, the sensing operation 14 is executed at a timing when the level of the sensing node SEN decreases to a threshold of the discriminating circuit of the sense amplifier S/A or less due to the cell current Id1. Similarly, the sensing operation 15 is executed at a timing when the level of the sensing node SEN decreases to a threshold of the discriminating circuit of the sense amplifier S/A or less due to the cell current Id2.

Further, when "0" is provided based on a value of the data latch DL obtained by the prereading operation, that is, in case of <situation 11>, data of the target memory cell MCt is determined based on the result of the sensing operation S14 and, in case of "1", that is, in case of <situation 12>, data of the target memory cell MCt is determined based on the result of the sensing operation S15. Further, this determined data is held in the data latch DL.

In addition, with the main reading operation according to the present embodiment, in a period between T15 and T16, the sense amplifier S/A executes two sensing operations of the sensing operations S14 and S15, and therefore the Icc peak current appears twice in the level stable period of the word lines WLn+1 and WLn. Further, in the period between T15 and T16, a voltage to be supplied to the adjacent word line WL is fixed (for example, the high reading pass voltage Vreadh), and therefore an Icc current value is provided in a fixed manner in an Icc current stable period.

As described above, with the reading sequence according to the present embodiment, data of the target memory cell MCt is determined based on sensing results of two different cell currents Id1 and Id2, so that it is possible to correct the amount fluctuation ΔVth (=ΔVg) of the threshold voltage Vth of the target memory cell MCt due to the inter-cell interference effect without switching the level of the adjacent word line WLn+1.

Further, with the present embodiment, the level of the adjacent word line WLn+1 is not switched upon the main reading operation, so that a waiting time the word lines WLn+1 and WLn and the bit line BL to be stable accompanying this switching is not required. Although a dotted line in FIG. 11 indicates an operation waveform in case of the comparative example also illustrated in FIG. 18, as is clear from FIG. 18, the main reading operation according to the present embodiment can reduce a processing time compared to the comparative example. More specifically, it is possible to reduce the processing time by ΔT (=T08−T16) in case of reading lower page data with the reading voltage RB.

As described above, according to the present embodiment, it is possible to not only correct fluctuation of a threshold voltage of a memory cell due to an inter-cell interference effect in the bit line direction, similar to the comparative example, but also reduce a processing time of the reading sequence compared to the comparative example.

In addition, the present embodiment can be implemented by a combination of the following second to fourth embodiments. In this case, the magnitude of the inter-cell interference effect is further segmentalized and, consequently, it is possible to more adequately correct a threshold voltage of a target memory cell.

Second Embodiment

The reading sequence according to the first embodiment is directed to correcting fluctuation of a threshold voltage of a target memory cell due to an inter-cell interference effect in the bit line direction. However, as also illustrated in FIG. 5, in the target memory cell, floating gates of memory cells adjacent in the word line direction are capacitatively coupled, and the inter-cell interference effect also occurs in the word line direction.

Hence, with the second embodiment, a NAND flash memory will be described which uses a reading sequence of compensating for the inter-cell interference effect in the word line direction.

Figure 12:
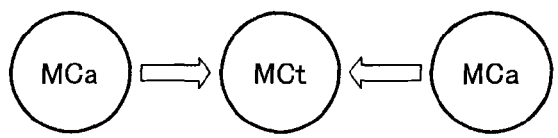
FIG. 12 is a view for describing an inter-cell interference effect produced between adjacent memory cells of the non-volatile semiconductor memory device according to a second embodiment in the word line direction.

With the first embodiment, only the inter-cell interference effect from the adjacent memory cell MCn+1 (MCa) for which the writing operation is executed after the target memory cell MCn (MCt) among the adjacent memory cells MCn−1 and MCn+1 needs to be taken into account. However, the NAND flash memory performs writing in page units including the memory cells MC commonly connected to predetermined word lines WL, and therefore the target memory cell MCt receives the inter-cell interference effects from both memory cells MCa adjacent in the word line direction as illustrated in FIG. 12.

Further, similar to the inter-cell interference effect in the bit line direction, as illustrated in FIG. 8, the inter-cell interference effect in the word line direction becomes significant when the threshold voltage Vth is transitioned from the ER level to the A level or from the LM level to the C level in the upper page program for the adjacent memory cell MCa.

That is, the inter-cell interference effect in the word line direction spreads from both adjacent memory cells MCa, so that it is possible to classify the amount of fluctuation of the threshold voltage of the target memory cell MCt into the following situations in order from the smallest amount of fluctuation.

<Situation 21> Each threshold voltage of both adjacent memory cells MCa is at the ER level or the B level, that is, both of inter-cell interference effects received from both adjacent memory cells MCa are small.

<Situation 22> The threshold voltage of one adjacent memory cell MCa is at the ER level or the B level and the threshold voltage of the other adjacent memory cell MCa is at the A level or the C level, that is, only the inter-cell interference effect received from one adjacent memory cell MCa is large.

<Situation 23> Each threshold voltage of both adjacent memory cells MCa is at the A level or the C level, that is, both of the inter-cell interference effects received from both adjacent memory cells MCa are large.

Figure 13:
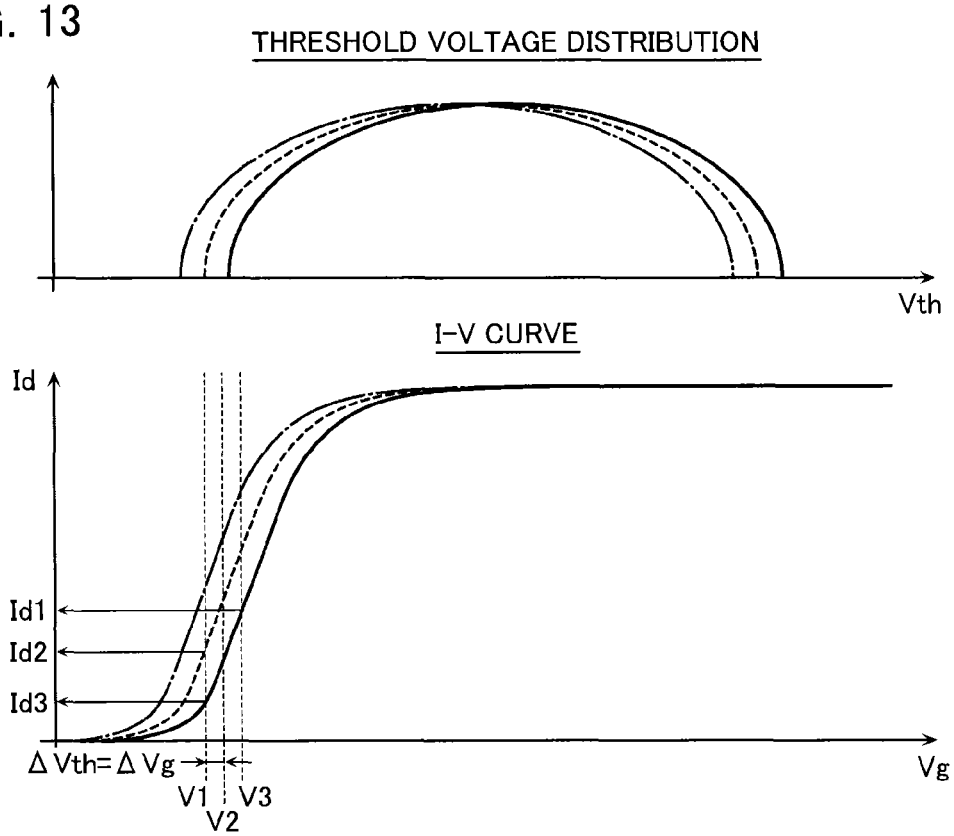
FIG. 13 is a view illustrating a threshold voltage distribution of the memory cell of the non-volatile semiconductor memory device according to the second embodiment, and characteristics of a gate voltage and a cell current.

A threshold voltage of the target memory cell MCt and an I-V curve in cases of above <situation 21> to <situation 23> are as illustrated in FIG. 13. FIG. 13 illustrates <situation 21> by a dashed line, <situation 22> by a dotted line and <situation 23> by a solid line. As is clear from FIG. 13, the threshold voltage distribution of the target memory cell MCt and the I-V curve both rise from <situation 21> in which the inter-cell interference effect is the least to <situation 23> in which the inter-cell interference effect is the most significant.

Meanwhile, with the reading sequence according to the present embodiment, the sense amplifier S/A executes the sensing operation for cell currents Id1 to Id3 illustrated in FIG. 13 to compensate for the inter-cell interference effect in the word line direction matching <situation 21> to <situation 23>.

Figure 14:
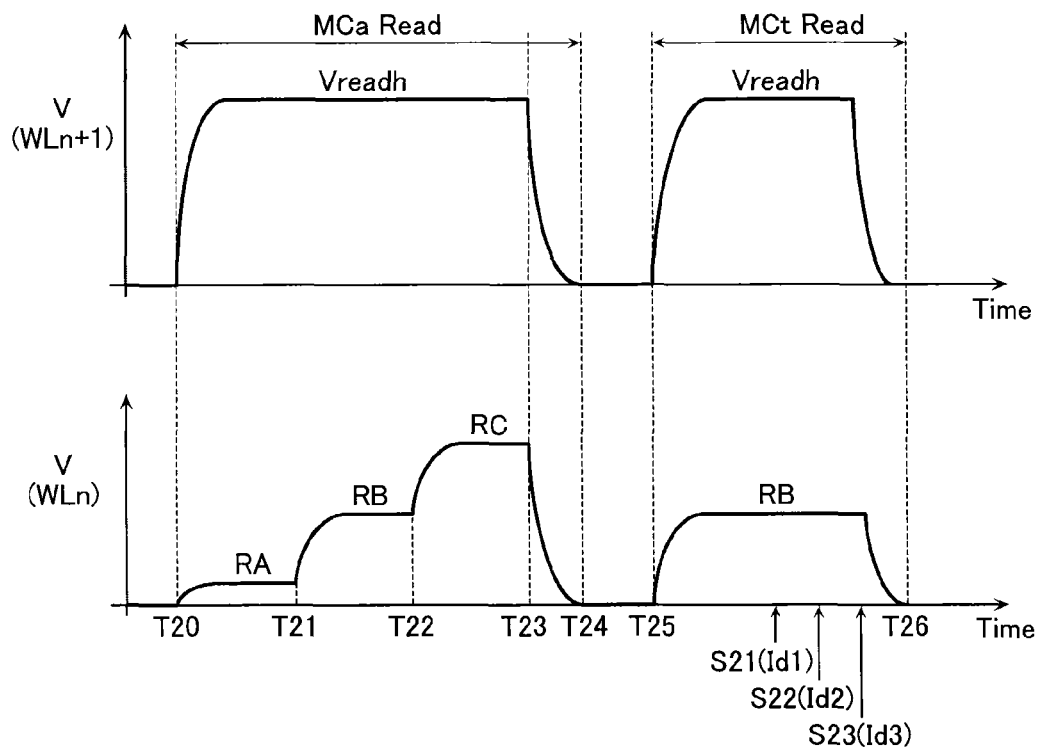
FIG. 14 is an operation waveform diagram upon a reading sequence in the non-volatile semiconductor memory device according to the second embodiment.

FIG. 14 is an operation waveform diagram of the adjacent word line WLn+1 and the selected word line WLn upon the reading sequence according to the present embodiment.

First, in a period between T20 to T24, a prereading operation is executed for the target memory cell MCt and two adjacent memory cells MCa commonly connected to the word line WLn.

In a period between T20 and T21, whether or not a threshold voltage of the adjacent memory cell MCa is at the A level or more is confirmed. Meanwhile, the reading pass voltage Vreadh (first reading pass voltage) is supplied to the adjacent word line WLn+1, and the reading voltage RA (first reading voltage) is supplied to the selected word line WLn.

In a period between T21 and T22, whether or not a threshold voltage of the adjacent memory cell MCa is at the B level or more is confirmed. Meanwhile, the high reading pass voltage Vreadh is continuously supplied to the adjacent word line WLn+1, and the reading voltage RB (first reading voltage) is supplied to the selected word line WLn.

In a period between T22 and T23, whether or not a threshold voltage of the adjacent memory cell MCa is at the C level or more is confirmed. Meanwhile, the high reading pass voltage Vreadh is continuously supplied to the adjacent word line WLn+1, and the reading voltage RC (first reading voltage) is supplied to the selected word line WLn.

The inter-cell interference effect in the word line direction is classified into above <situation 21> to <situation 23>, and, with the main reading operation executed later, to determine which situation applies, two data latches DL which hold data of the adjacent memory cells MCa are prepared in addition to the data latch DL which holds data of the target memory cell MCt. The data latch which holds data of the target memory cell MCt is DL3, and the data latches which hold data of the adjacent memory cells MCa are DL1 and DL2.

Figure 15:
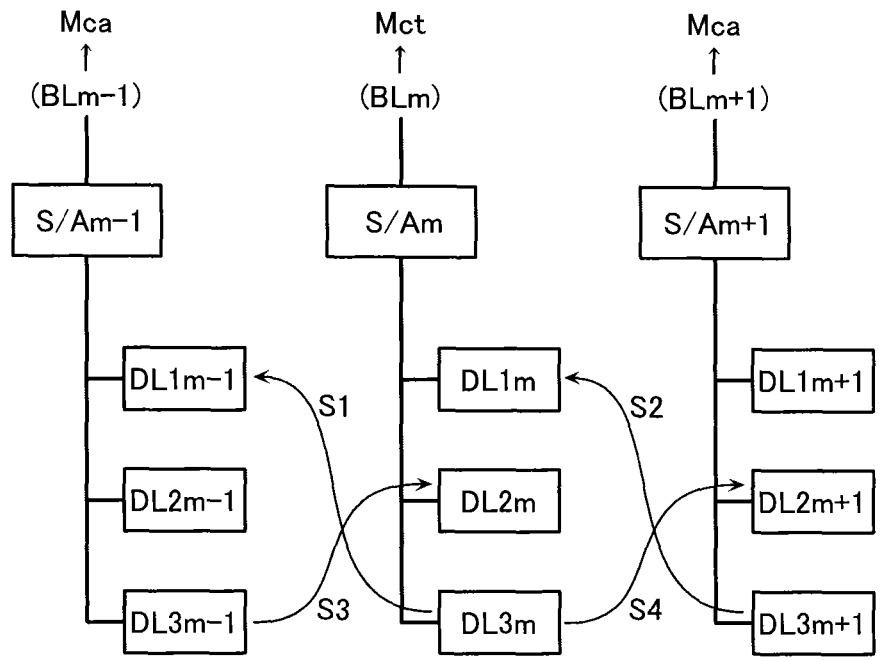
FIG. 15 is a view for describing data transfer between data latches in the non-volatile semiconductor memory device according to the second embodiment.

Meanwhile, a method of storing read data in the data latches DL1 to DL3 in the prereading operation will be described using FIG. 15. In FIG. 15, a bit line connected to the target memory cell MCt is BLm, a sense amplifier connected to this bit line BLm is S/Am, and three data latches are DL1m (first data latch), DL2m (second data latch) and DL3m (third data latch), respectively. Further, a bit line connected to one adjacent memory cell MCa is BLm−1, a sense amplifier connected to this bit line BLm−1 is S/Am−1 and three data latches are DL1m−1, DL2m−1 and DL3m−1, respectively. Similarly, a bit line connected to the other adjacent memory cell MCa is BLm+1, a sense amplifier connected to this bit line BLm+1 is S/Am+1 and three data latches are DL1m+1, DL2m+1 and DL3m+1, respectively.

First, when the threshold voltages of the memory cells MCt and MCa are determined, if threshold voltages of the memory cells MCt and MCa are at the ER level or the B level, "0" is held as a determination value and, if the threshold voltages are at the A level or the C level, "1" is held as a determination value, and the determination value is held in the data latches DL3m−1, DL3m and DL3m+1 associated with the memory cells MCt and MCa.

Subsequently, in step S1, data of the target memory cell MCt is transferred from the data latch DL3m to the data latch DL1m−1.

Subsequently, in step S2, data of one adjacent memory cell MCa is transferred from the data latch DL3m+1 to the data latch DL1m.

Subsequently, in step S3, data of the other adjacent memory cell MCa is transferred from the data latch DL3$m$−1 to the data latch DL2$m$.

Finally, in step S4, data of the target memory cell MCt is transferred from the data latch DL3$m$ to the data latch DL2$m$+1.

According to a series of these operations, the data latches DL1 and DL2 matching each bit line hold data of adjacent memory cells. Consequently, values held by the data latch DL1$m$, DL2$m$ and DL3$m$ matching the bit line BL$m$ are as follows. That is, (DL1, DL2)=("0", "0") hold in case of <situation 21>, (DL1, DL2)=("0", "1") or ("1", "0") hold in case of <situation 22> and (DL1, DL2)=("1", "1") hold in case of <situation 23>.

Subsequently, in a period between T32 and T33, the main reading operation is executed for the target memory cell MCt.

Meanwhile, for example, the high reading pass voltage Vreadh (second reading pass voltage) is supplied to the adjacent word line WLn+1 as a fixed voltage, and the fixed reading voltage RB (second reading voltage) is supplied to the selected word line WLn, and sensing operations including a sensing operation S31 of the cell current Id1, a sensing operation S32 of the cell current Id2 and a sensing operation S33 of a cell current Id3 are executed three times in total in a level stable period of the word lines WLn+1 and WLn.

In addition, the sensing operation 31 is executed at a timing when the level of the sensing node SEN decreases to a threshold of the discriminating circuit of the sense amplifier S/A or less due to the cell current Id1. The sensing operation 32 is executed at a timing when the level of the sensing node SEN decreases to a threshold of the discriminating circuit of the sense amplifier S/A or less due to the cell current Id2. Similarly, the sensing operation 33 is executed at a timing when the level of the sensing node SEN decreases to a threshold of the discriminating circuit of the sense amplifier S/A or less due to the cell current Id3.

Further, when (DL1$m$, DL2$m$)=("0", "0") is provided based on values of the data latch DL$m$1 and DL$m$2 obtained by the prereading operation, that is, incase of <situation 21>, data of the target memory cell MCt is determined based on a result of the sensing operation S31. Incase of (DL1$m$, DL2$m$)=("0", "1") or ("1", "0"), that is, in case of <situation 22>, data of the target memory cell MCt is determined based on a result of the sensing operation S32. Similarly, in case of (DL1$m$, DL2$m$)=("1", "1"), that is, in case of <situation 23>, data of the target memory cell MCt is determined based on a result of the sensing operation S33. Further, this decided data is held in the data latch DL DL3$m$.

In addition, with the main reading operation according to the present embodiment, in a period between T25 and T26, the sense amplifier S/A executes three sensing operations of the sensing operations S21 to S23, and therefore the Icc peak current appears three times in the level stable period of the word line WLn+1 and WLn. Further, in the period between T25 and T26, a voltage to be supplied to the adjacent word line WLn+1 is fixed (for example, the high reading pass voltage Vreadh), and therefore an Icc current value is provided in a fixed manner in a current stable period.

As described above, according to the present embodiment, it is possible not only to correct fluctuation of a threshold voltage of a memory cell due to an inter-cell interference effect in the bit line direction, but also reduce a processing time of the reading sequence similar to the first embodiment because a waiting time the word lines and the bit lines to be stable is not required.

In addition, the present embodiment can be implemented in combination with the first embodiment. In that case, the magnitude of the inter-cell interference effect is further segmentalized and, consequently, it is possible to more adequately correct a threshold voltage of a target memory cell.

Third Embodiment

A NAND flash memory will be described with a third embodiment which uses a reading sequence of compensating for an inter-cell interference effect in the word line direction. The present embodiment is a modified example of the second embodiment.

With the NAND flash memory, a writing operation is generally executed in order from the lowest threshold voltage. More specifically, When quadrature data is written, writing is executed in order of the A level, the B level and the C level.

A rise in a threshold voltage due to the inter-cell interference effect is caused by the writing operation for an adjacent memory cell, which is executed after the threshold voltage of the target cell is determined by passing a verify operation. That is, a target memory cell having the A level of the threshold voltage receives more inter-cell interference effect by a B level or C level writing operation for the adjacent memory cell. Particularly, the C level writing operation involves a significant amount of fluctuation of the threshold voltage of the adjacent memory cell as illustrated in FIG. 8, and therefore the inter-cell interference effect also becomes significant for the target memory cell in proportion to the amount of fluctuation. Further, a target memory cell having the B level of the threshold voltage receives the inter-cell interference effect by the C level writing operation for the adjacent memory cell. In addition, although the target memory cell having the C level of the threshold voltage receives the inter-cell interference effect even upon the C level writing operation for the adjacent memory cell, the C level writing operation is simultaneously executed for the target memory cell and the adjacent memory cell, and therefore the inter-cell interference effect becomes a little.

Hence, with the present embodiment, data of a target memory cell is determined by changing a condition depending on whether a threshold voltage of an adjacent memory cell is at the C level or less.

Situations of the target memory cell according to the present embodiment include the following three situations.

<Situation 31> Both of threshold voltages of both of adjacent memory cells are not at the C level.

<Situation 32> A threshold voltage of only one adjacent memory cell is at the C level.

<Situation 33> Threshold voltages of both of the adjacent memory cells are at the C level.

Figure 16:
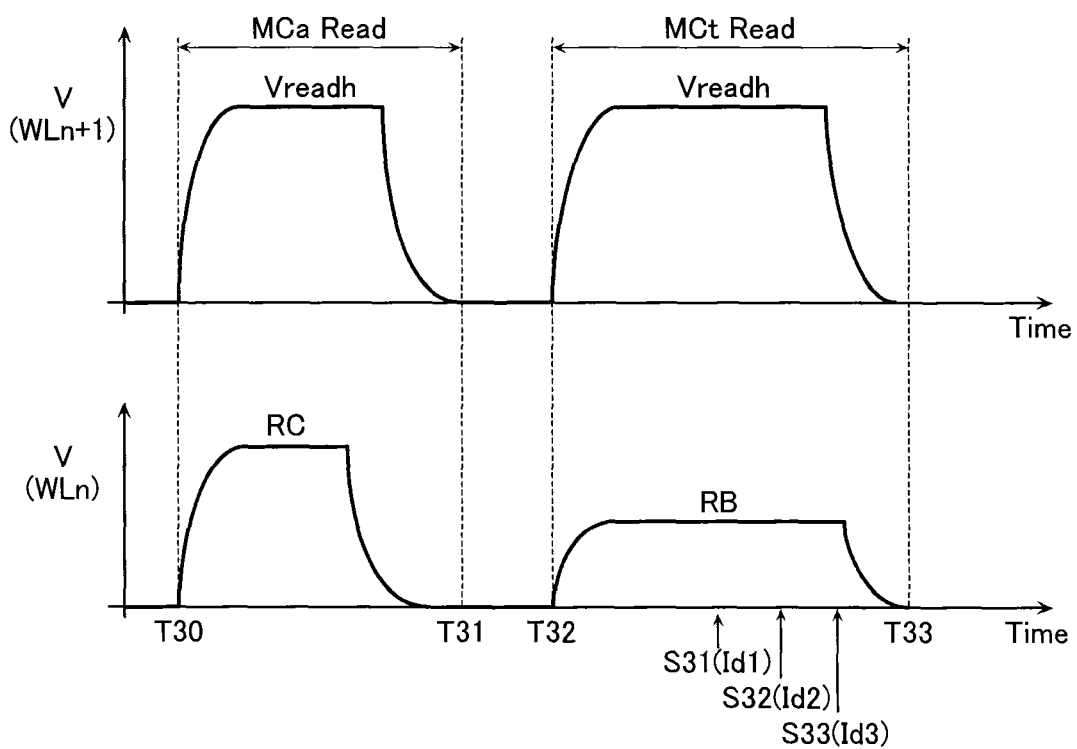
FIG. 16 is an operation waveform diagram upon a reading sequence in a non-volatile semiconductor memory device according to a third embodiment.

FIG. 16 is an operation waveform diagram of the word lines WLn+1 and WLn upon the reading sequence according to the present embodiment.

First, in a period between T30 and T31, the prereading operation is executed for the adjacent memory cell MCa.

Meanwhile, to confirm whether or not the threshold voltage of the adjacent memory cell MCa is at the C level, the high reading pass voltage Vreadh (first reading pass voltage) is supplied to the adjacent word line WLn+1, and the reading voltage RC (first reading voltage) is supplied to the selected word line WLn. As a result, for the data latches DL3$m$−1 and DL3$m$+1 associated with the adjacent memory cell MCa, "1" is held as a determination value when the threshold voltage of the adjacent memory cell MCa is at the C level, and "0" is held as a determination value when the threshold voltage is not at the C level.

Then, when data transfer illustrated in FIG. 15 is executed, the data latches DL1$m$ and DL2$m$ associated with the target memory cell MCt are as follows. That is, (DL1m, DL2m)= ("0", "0") hold in case of <situation 31>, (DL1m, DL2m)= ("0", "1") or ("1", "0") hold in case of <situation 32> and (DL1m, DL2m)=("1", "1") hold in case of <situation 33>.

In case of the prereading operation according to the present embodiment, whether or not the threshold voltage of the adjacent memory cell MCa is at the C level is confirmed, so that it is possible to reduce a processing time of the prereading operation more than the second embodiment.

Subsequently, in a period between T32 and T33, the main reading operation is executed for the target memory cell MCt.

Meanwhile, the fixed high reading pass voltage Vreadh (second reading pass voltage) is supplied to the adjacent word line WLn+1, and the reading voltage RB (second reading voltage) is supplied to the fixed selected word line WLn, and, similar to the second embodiment, sensing operations including a sensing operation S31 of the cell current Id1, a sensing operation S32 of the cell current Id2 (<Id1) and a sensing operation S33 of a cell current Id3 (<Id2) are executed three times in total in a level stable period of the word lines WLn+1 and WLn.

Further, as a result of the prereading operation, data of the target memory cell MCt is determined based on the sensing operation S31 in case of <situation 31>, the sensing operation S32 in case of <situation 32> and the sensing operation S33 in case of <situation 33>.

As described above, according to the present embodiment, it is possible to not only correct an inter-cell interference effect in the word line direction resulting from the C level writing operation of the adjacent memory cell, but also reduce a processing time of the prereading operation more than the second embodiment.

Fourth Embodiment

A NAND flash memory will be described with a fourth embodiment which uses a reading sequence of compensating for an inter-cell interference effect in the word line direction. The present embodiment is a modified example of the second embodiment.

The third embodiment assumes that the NAND flash memory which performs a writing operation sequentially in order from the lowest threshold voltage. By contrast with this, the present embodiment assumes a NAND flash memory which executes first only the C level writing operation and verity operation, or the B level and C level writing operation and verify operation, until all memory cells which are writing targets pass verify, and then executes the A level and B level or only the A level writing operation.

In this case, only the A level or the B level writing operation is executed finally. The amount of fluctuation of a threshold voltage upon the B level writing operation is a little, and therefore the inter-cell interference effect is small. That is, when a threshold voltage of the adjacent memory cell is at the A level, the target memory cell receives the most significant inter-cell interference effect. Hence, with the present embodiment, data of a target memory cell is determined by changing a condition depending on whether a threshold voltage of an adjacent memory cell is at the A level or less.

Situations of the target memory cell according to the present embodiment include the following three situations.

<Situation 41> Both of threshold voltages of adjacent memory cells are not at the A level.

<Situation 42> A threshold voltage of only one adjacent memory cell is at the A level.

<Situation 43> Threshold voltages of both of adjacent memory cells are at the A level.

Figure 17:
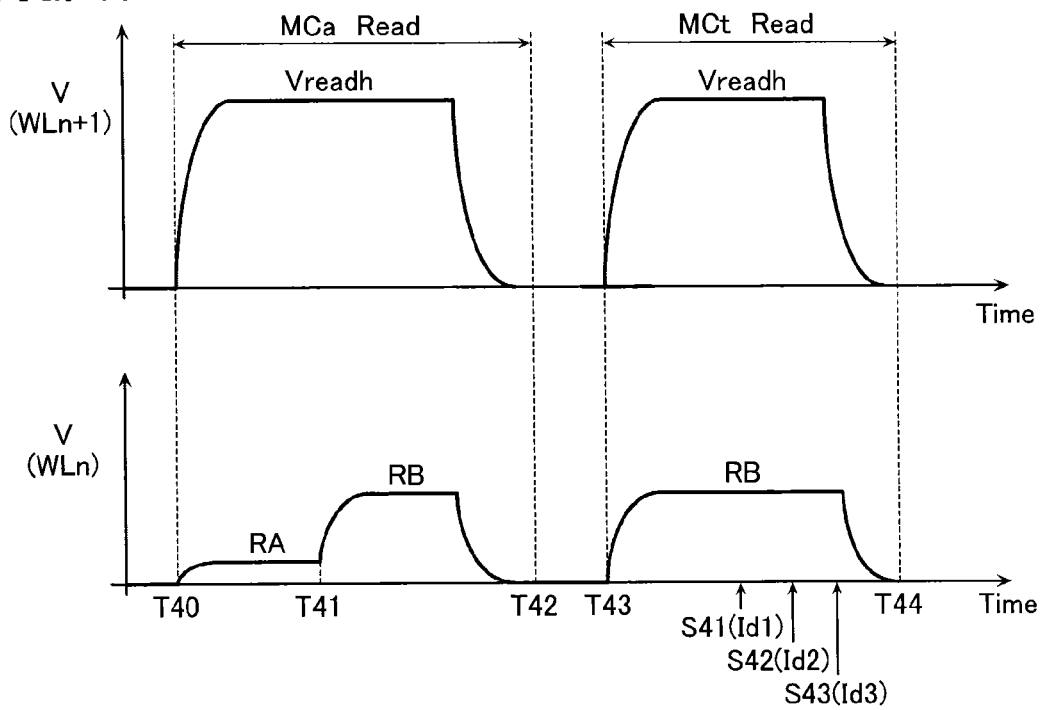
FIG. 17 is an operation waveform diagram upon a reading sequence in a non-volatile semiconductor memory device according to a fourth embodiment.

FIG. 17 is an operation waveform diagram of the word lines WLn+1 and WLn upon the reading sequence according to the present embodiment.

First, in a period between T40 and T42, the prereading operation is executed for the adjacent memory cell MCa.

In a period between T40 and T41, whether or not a threshold voltage of the adjacent memory cell MCa is at the A level or more is confirmed. Meanwhile, the high reading pass voltage Vreadh (first reading pass voltage) is supplied to the adjacent word line WLn+1, and the reading voltage RA (first reading voltage) is supplied to the selected word line WLn.

In a period between T41 and T42, whether or not a threshold voltage of the adjacent memory cell MCa is at the B level or more is confirmed. Meanwhile, the high reading pass voltage Vreadh is continuously supplied to the adjacent word line WLn+1, and the reading voltage VB (first reading voltage) is supplied to the selected word line WLn.

As a result, when the threshold voltage of the adjacent memory cell MCa is at the A level, "1" is held in the corresponding data latches DL3m−1 and DLm+1.

Then, when data transfer illustrated in FIG. 15 is executed, the data latches DL1m and DL2m associated with the target memory cell MCt are as follows. That is, (DL1m, DL2m)= ("0", "0") hold in case of <situation 41>, (DL1m, DL2m)= ("0", "1") or ("1", "0") hold in case of <situation 42>, and (DL1m, DL2m)=("1", "1") hold in case of <situation 43>.

In case of the prereading operation according to the present embodiment, whether or not the threshold voltage of the adjacent memory cell MCa is at the A level is confirmed, so that it is possible to reduce a processing time of the prereading operation compared to the second embodiment.

Subsequently, in a period between T43 and T44, the main reading operation is executed for the target memory cell MCt.

Meanwhile, the fixed high reading pass voltage Vreadh (second reading pass voltage) is supplied to the adjacent word line WLn+1, and the fixed reading voltage RB (second reading voltage) is supplied to the selected word line WLn, and, similar to the second and third embodiments, sensing operations including a sensing operation S41 of the cell current Id1, a sensing operation S42 of the cell current Id2 and a sensing operation S43 of a cell current Id3 are executed three times in total in a level stable period of the word lines WLn+1 and WLn.

Further, as a result of the prereading operation, data of the target memory cell MCt is determined based on the sensing operation S41 in case of <situation 41>, the sensing operation S42 in case of <situation 42> and the sensing operation S43 in case of <situation 43>.

As described above, according to the present embodiment, it is possible to not only correct an inter-cell interference effect resulting from the A level writing operation of the adjacent memory cell, but also reduce a processing time of the prereading operation compared to the second embodiment.

[Other]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
   a memory cell array which comprises a plurality of bit lines, a plurality of word lines and source lines crossing the bit lines, and a plurality of memory cells which comprise control gates connected to the word lines and which are connected in series, and which comprises a plurality of NAND strings with both ends connected to the bit lines and the source lines; and
   a reading circuit which executes a reading sequence of reading data from a target memory cell of the plurality of memory cells which is a reading target,
   when the word line connected to the target memory cell is a selected word line and a word line adjacent to the selected word line is an adjacent word line among the plurality of word lines, in the reading sequence,
   the reading circuit executing a prereading operation of supplying a first reading voltage to the adjacent word line and supplying a first reading pass voltage for conducting the memory cells, to the selected word line, and
   after executing the prereading operation, executing a main reading operation of supplying a fixed second reading voltage to the selected word line and supplying a fixed second reading pass voltage for conducting the memory cells, to the adjacent word line while sensing a plurality of electrical physical amounts of the target memory cell which appear in the bit lines.

2. The non-volatile semiconductor memory device according to claim 1, wherein, in one main reading operation, the reading circuit executes a plurality times of sensing with different conditions for obtaining the electrical physical amounts.

3. The non-volatile semiconductor memory device according to claim 1, wherein, when the memory cell which belongs to a same NAND string as the target memory cell and which is adjacent to the target memory cell is an adjacent memory cell, in the main reading operation, the reading circuit selects a sensing result of one of the electrical physical amounts based on a situation determined according to data of the adjacent memory cell which is obtained in the prereading operation, among sensing results of the plurality of electrical physical amounts, and determines data of the target memory cell based on the selected sensing result.

4. The non-volatile semiconductor memory device according to claim 1, wherein, in the prereading operation, the reading circuit supplies to the adjacent word line the first reading voltage which changes stepwise.

5. The non-volatile semiconductor memory device according to claim 1, wherein the second reading pass voltage is higher than the first reading pass voltage.

6. The non-volatile semiconductor memory device according to claim 1, wherein the electrical physical amounts are cell currents flowing in the bit lines according to data of the target memory cell.

7. The non-volatile semiconductor memory device according to claim 6, wherein the electrical physical amounts are cell currents flowing in the bit lines according to data of the target memory cell.

8. A non-volatile semiconductor memory device comprising:
   a memory cell array which comprises a plurality of bit lines, a plurality of word lines and source lines crossing the bit lines, and a plurality of memory cells which comprise control gates connected to the word lines and which are connected in series, and which comprises a plurality of NAND strings with both ends connected to the bit lines and the source lines; and
   a reading circuit which executes a reading sequence of reading data from a target memory cell of the plurality of memory cells which is a reading target,
   when the word line connected to the target memory cell is a selected word line and a word line adjacent to the selected word line is an adjacent word line among the plurality of word lines, in the reading sequence,
   the reading circuit executing a prereading operation of supplying a first reading voltage to the selected word line and supplying a first reading pass voltage for conducting the memory cells, to the adjacent word line, and
   after executing the prereading operation, executing a main reading operation of supplying a fixed second reading voltage to the selected word line and supplying a fixed second reading pass voltage for conducting the memory cells, to the adjacent word line while sensing a plurality of electrical physical amounts of the target memory cell which appear in the bit lines.

9. The non-volatile semiconductor memory device according to claim 8, wherein, in one main reading operation, the reading circuit executes a plurality times of sensing with different conditions for obtaining the electrical physical amounts.

10. The non-volatile semiconductor memory device according to claim 8, wherein, when the memory cell which is connected to the selected word line and which is adjacent to the target memory cell in a longitudinal direction of the word line is an adjacent memory cell, in the main reading operation, the reading circuit selects a sensing result of one of the electrical physical amounts based on a situation determined according to data of the adjacent memory cell which is obtained in the prereading operation, among sensing results of the plurality of electrical physical amounts, and determines data of the target memory cell based on the selected sensing result.

11. The non-volatile semiconductor memory device according to claim 8, wherein, in the prereading operation, the reading circuit supplies to the selected word line the first reading voltage which changes stepwise.

12. The non-volatile semiconductor memory device according to claim 10, wherein: the memory cell stores n value (n≥3) data; and in the prereading operation, the reading circuit generates a determination value equal to or less than an n−1 stage based on data of the adjacent memory cell, and determines the situation based on the determination value.

13. The non-volatile semiconductor memory device according to claim 10, wherein, the prereading operation includes determining whether or not data of the adjacent memory cell is predetermined data, and determining the situation based on a result of the determination.

14. The non-volatile semiconductor memory device according to claim 10, wherein the reading circuit comprises for an m-th bit line: a first data latch which holds a determination value based on data of the memory cell belonging to the NAND string connected to an m+1th bit line adjacent to one side of the m-th bit line; and a second data latch which holds a determination value based on data of the memory cell belonging to the NAND string connected to an m−1th bit line adjacent to another side of the m-th bit line.

15. The non-volatile semiconductor memory device according to claim 14, wherein the reading circuit has for an m-th bit line a third data latch which holds a determination value based on data of the memory cell belonging to the NAND string connected to the m-th bit line.

16. The non-volatile semiconductor memory device according to claim 15, wherein, in the prereading operation, the reading circuit causes: the first data latch associated with the m−1th bit line to hold a determination value held by the third data latch associated with the m-th bit line; the first data latch associated with the m-th bit line to hold a determination value held by the third data latch associated with the m+1th bit line; the second data latch associated with the m-th bit line to hold a determination value held by the third data latch associated with the m−1th bit line; and the second data latch associated with the m+1th bit line to hold a determination value held by the third data latch associated with the m-th bit line.

17. A non-volatile semiconductor memory device comprising:
- a memory cell array which comprises a plurality of bit lines, a plurality of word lines and source lines crossing the bit lines, and a plurality of memory cells which comprise control gates connected to the word lines and which are connected in series, and which comprises a plurality of NAND strings with both ends connected to the bit lines and the source lines; and
- a reading circuit which executes a reading sequence of reading data from a target memory cell of the plurality of memory cells which is a reading target,
- when the word line connected to the target memory cell is a selected word line and a word line adjacent to the selected word line is an adjacent word line among the plurality of word lines, in the reading sequence,
- the reading circuit executing a prereading operation of reading data of one, two or more adjacent memory cells adjacent to the target memory cell in at least one of a bit line direction and a word line direction; and
- after executing the prereading operation, executing a main reading operation of supplying a fixed second reading voltage to the selected word line and supplying a fixed second reading pass voltage to the adjacent word line while sensing a plurality of electrical physical amounts of the target memory cell which appear in the bit lines.

18. The non-volatile semiconductor memory device according to claim 17, wherein, in one main reading operation, the reading circuit executes a plurality times of sensing with different conditions for obtaining the electrical physical amounts.

19. The non-volatile semiconductor memory device according to claim 17, wherein, in the main reading operation, the reading circuit selects a sensing result of one of the electrical physical amounts based on a situation determined according to data of the adjacent memory cell which is obtained in the prereading operation, among sensing results of the plurality of electrical physical amounts, and decides data of the target memory cell based on the selected sensing result.

20. The non-volatile semiconductor memory device according to claim 17, wherein the electrical physical amounts are cell currents flowing in the bit lines according to data of the target memory cell.

* * * * *